(12) United States Patent
Chu et al.

(10) Patent No.: US 8,110,836 B2
(45) Date of Patent: Feb. 7, 2012

(54) SEMICONDUCTOR DEVICE

(75) Inventors: Shucheng Chu, Hamamatsu (JP);
Hirofumi Kan, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 364 days.

(21) Appl. No.: 11/892,420

(22) Filed: Aug. 22, 2007

(65) Prior Publication Data
US 2008/0048197 A1 Feb. 28, 2008

(30) Foreign Application Priority Data

Aug. 24, 2006 (JP) ................ P2006-228007

(51) Int. Cl.
*H01L 27/15* (2006.01)
(52) U.S. Cl. .................. 257/79; 257/E31.013
(58) Field of Classification Search .......... 257/E31.013, 257/79
See application file for complete search history.

(56) References Cited

U.S. PATENT DOCUMENTS

| 4,689,667 A | 8/1987 | Aronowitz | |
| 5,726,464 A * | 3/1998 | Kumomi et al. | 257/103 |
| 2005/0186435 A1 * | 8/2005 | Chu et al. | 428/446 |

FOREIGN PATENT DOCUMENTS

| JP | 50-39074 | 4/1975 |
| JP | 51-110272 | 9/1976 |
| JP | 59-180453 | 10/1984 |
| JP | 62-42418 | 2/1987 |
| JP | 04-356977 | 12/1992 |
| JP | 08-046245 | 2/1996 |
| JP | 8-139359 | 5/1996 |
| JP | 09-191127 | 7/1997 |
| JP | 11-017216 | 1/1999 |
| JP | 2000-058867 | 2/2000 |
| JP | 2001-064099 | 3/2001 |
| JP | 2004-095858 | 3/2004 |
| JP | 2006-019426 | 1/2006 |

OTHER PUBLICATIONS

Muret et al., "Transport properties of unintentionally doped iron silicide thin films on silicon(111)," J. Vac. Sci. Tech. B, 16(3) 1663, 1998.*
Misiuk et al. "Photoluminescence From Pressure—Annealed Nanaostructured Silicon Dioxide and Nitride Films," Nato Advanced Research Workshop on Nanostructured Films and Coatins. Series 3 High Technology—vol. 78, 2000.*
Misiuk et al. "Photoluminescence of Porous Silicon Prepared from Pressure Treated Cz-Si," phys. stat. sol. (a) 182 401, 2000.*

(Continued)

*Primary Examiner* — Matthew Reames
(74) *Attorney, Agent, or Firm* — Drinker Biddle & Reath LLP

(57) ABSTRACT

A semiconductor is provided with: a silicon substrate $2a$ of a first conductivity type, including a first surface $S1a$ and a second surface $S2a$; a silicon layer $4a$ of a second conductivity type, arranged on the first surface $S1a$ of the silicon substrate $2a$, including a third surface $S3a$ opposite a junction surface with the silicon substrate $2a$; a first electrode $12a$ arranged on the second surface $S2a$; a second electrode $14a$ arranged on the third surface $S3a$; and an argon added area $6a$ formed in a semiconductor area formed of the silicon substrate $2a$ and the silicon layer $4a$. The argon added area $6a$ includes an area indicating an argon concentration of a minimum of $1 \times 10^{18}$ cm$^{-3}$ and a maximum of $2 \times 10^{20}$ cm$^{-3}$.

3 Claims, 7 Drawing Sheets

OTHER PUBLICATIONS

A. Milgram et al., "Effect of argon implantation on the activation of boron implanted in silicon", *Applied Physics Letters*, vol. 42 (10), May 15, 1983, pp. 878-880.

N. Burger et al., "New Class of Related Optical Defects in Silicon Implanted with the Noble Gases He, Ne, Ar, Kr, and Xe", *Physical Review Letters*, vol. 52, No. 18, Apr. 30, 1984, pp. 1645-1648.

* cited by examiner

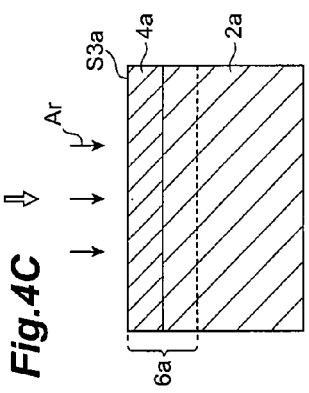
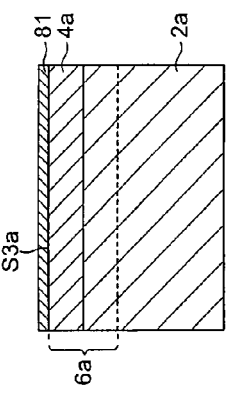
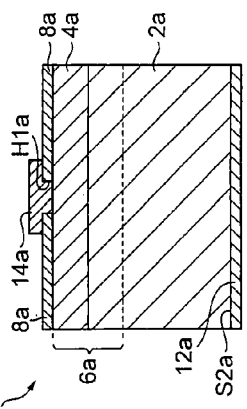
Fig.4A
Fig.4B
Fig.4C
Fig.4D
Fig.4E
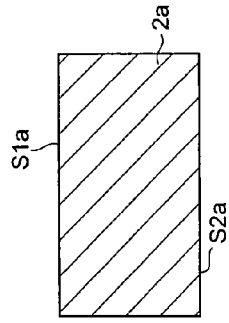
Fig.3A
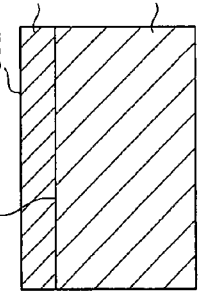
Fig.3B

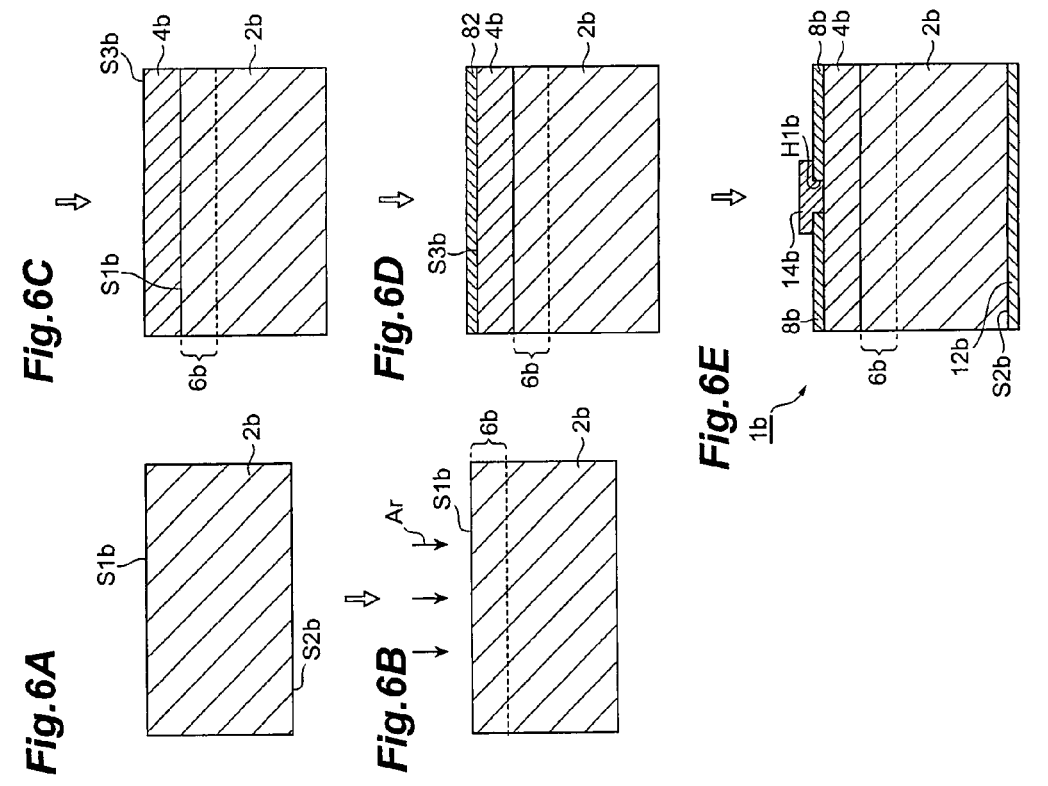
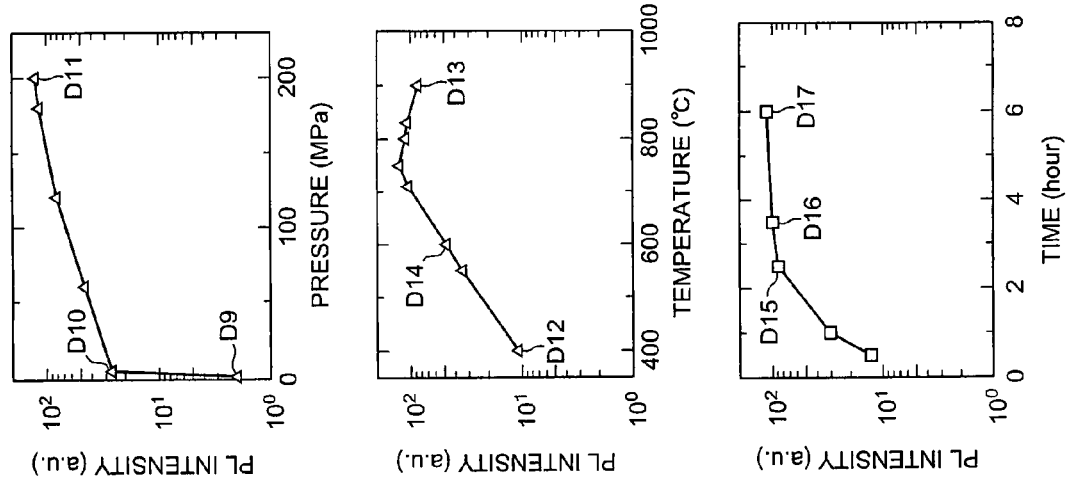

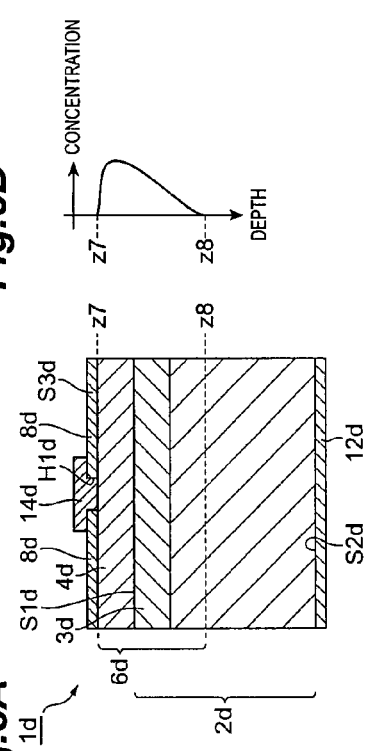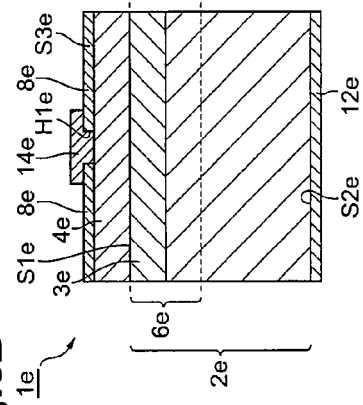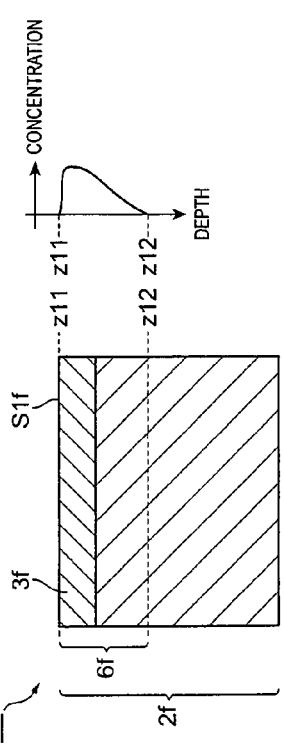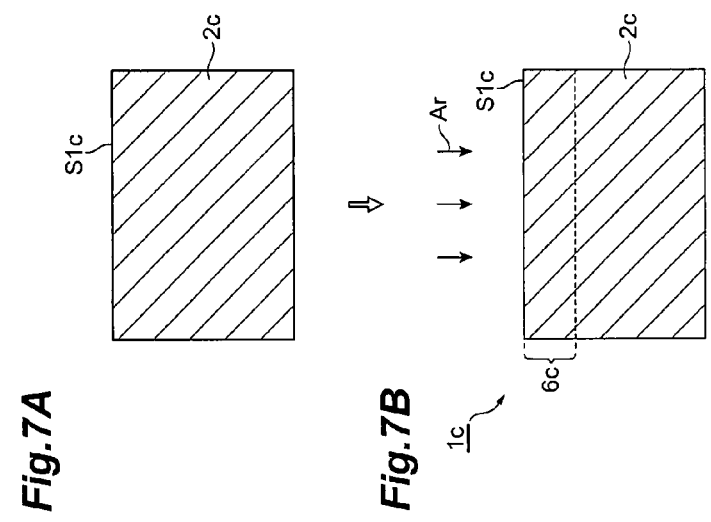

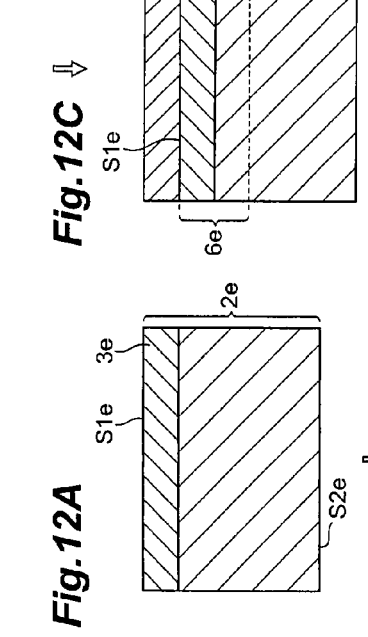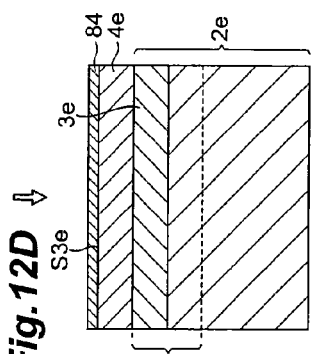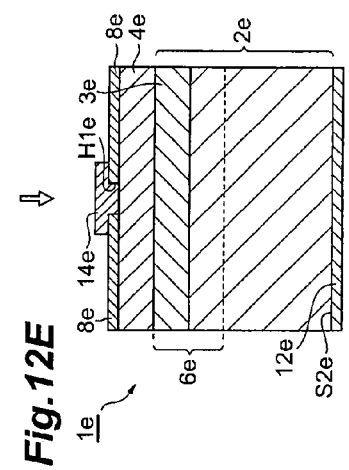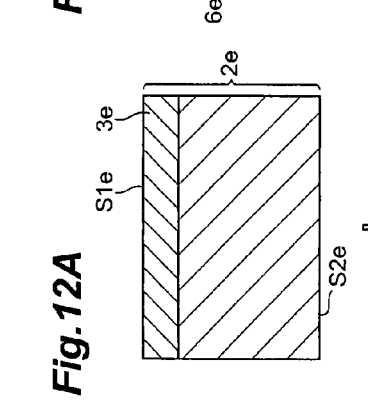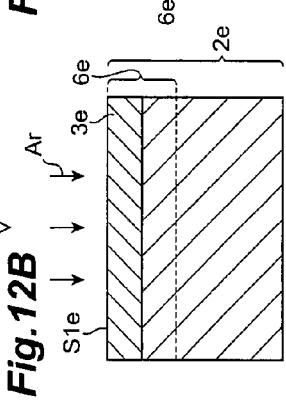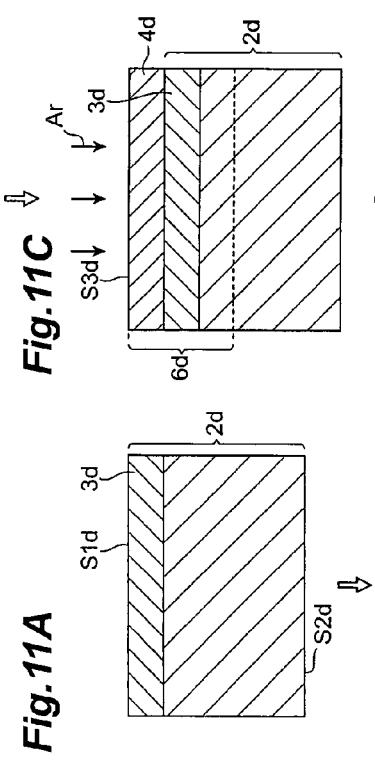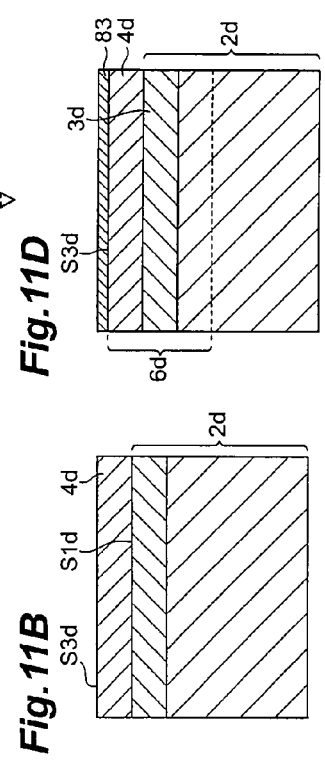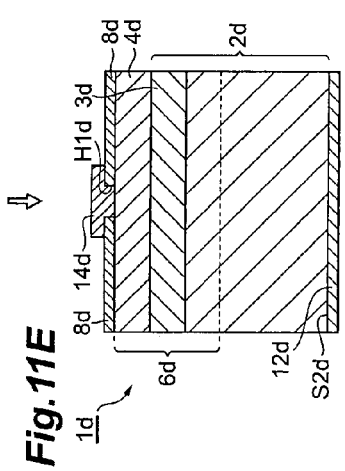

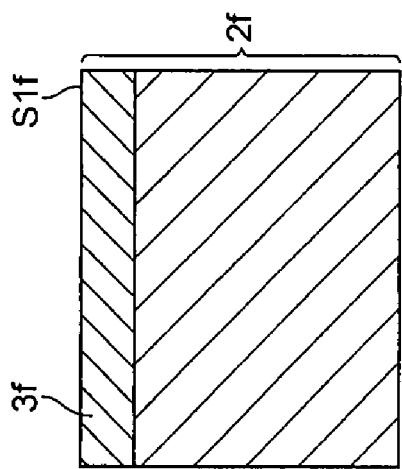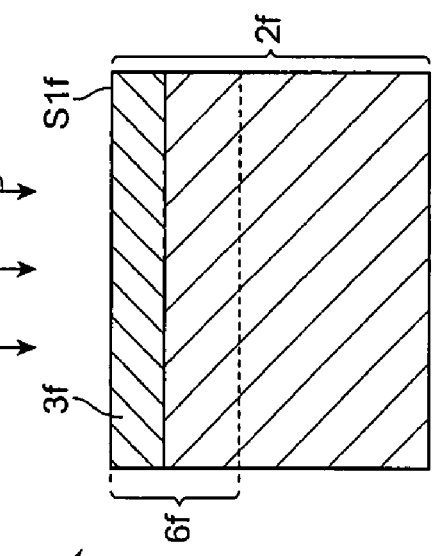
Fig.13A    Fig.13B

SEMICONDUCTOR DEVICE

BACKGROUND OF THE INVENTION

1. Field of the Invention

The present invention relates to a semiconductor device.

2. Related Background Art

Conventionally, semiconductor devices such as an LED and an LD, in which a compound semiconductor such as a III-V semiconductor crystal or the like is used as a material, have been widely used. At the same time, studies of a semiconductor device in which silicon is used as a material have also progressed. A light-emission intensity of single-crystal silicon which emits light of 1.13 μm at room temperature is very low as compared to that of the above-described compound semiconductors. It is known, however, that porous silicon or the like, for example, in which the silicon is used as a material, emits a visible light of which intensity is large as compared to the single-crystal silicon. Therefore, as is described in the Patent Document 1 (Japanese Patent Application Laid-open No. Hei 08-139359), for example, research and development in a semiconductor device in which the porous silicon or the like is used have progressed.

SUMMARY OF THE INVENTION

It is true that the conventional silicon semiconductor device in which the porous silicon or the like is used is expected to exhibit an improvement in light-emission intensity as compared to the single-crystal silicon, however, a sufficient light-emission intensity has not yet been reached.

Therefore, an object of the present invention is to improve the light-emission intensity of the silicon semiconductor device.

A semiconductor device of the present invention is provided with: a silicon substrate of a first conductivity type, including a first surface and a second surface opposite the first surface; a silicon layer of a second conductivity type, arranged on the first surface of the silicon substrate, including a third surface opposite a junction surface with the silicon substrate; a first electrode arranged on the second surface; a second electrode arranged on the third surface; and an argon added area formed in a semiconductor area formed of the silicon substrate and the silicon layer. The argon added area includes an area indicating an argon concentration of a minimum of $1\times10^{18}$ cm$^{-3}$ and a maximum of $2\times10^{20}$ cm$^{-3}$. Further, the argon added area may be formed from the third surface to the inside of the semiconductor area, or from the first surface to the inside of the silicon substrate. The silicon substrate may include a porous silicon area formed from the first surface to the inside of the silicon substrate.

Thus, the semiconductor device of the present invention includes the argon added area that includes an area indicating an argon concentration of a minimum of $1\times10^{18}$ cm$^{-3}$ and a maximum of $2\times10^{20}$ cm$^{-3}$. As a result of intensive studies, the inventor has found that the arrangement of an argon added area that includes an argon concentration of a minimum of $1\times10^{18}$ cm$^{-3}$ and a maximum of $2\times10^{20}$ cm$^{-3}$ leads to improvement in intensity of an electric luminescence (EL) light emission and that of a photo luminescence (PL) light emission, as compared to a semiconductor device to which no argon is added. Therefore, according to the semiconductor device of the present invention, the intensity of EL light emission (EL intensity) and the intensity of the PL light emission (PL intensity) are improved.

The semiconductor device of the present invention includes a silicon substrate, including an argon added area to which argon is added, having a first surface, wherein the argon added area includes an area indicating an argon concentration of a minimum of $1\times10^{18}$ cm$^{-3}$ and a maximum of $2\times10^{20}$ cm$^{-3}$, and is formed from the first surface to the inside of the silicon substrate. Further, the silicon substrate may include a porous silicon area formed from the first surface to the inside of the silicon substrate.

Thus, the semiconductor device of the present invention includes the argon added area that includes the area indicating an argon concentration of a minimum of $1\times10^{18}$ cm$^{-3}$ and a maximum of $2\times10^{20}$ cm$^{-3}$. As a result of intensive studies, the inventor has found that the arrangement of an argon added area that includes an argon concentration of a minimum of $1\times10^{18}$ cm$^{-3}$ and a maximum of $2\times10^{20}$ cm$^{-3}$ leads to improvement in the PL intensity, as compared to a semiconductor device to which no argon is added. Therefore, according to the semiconductor device of the present invention, the PL intensity is improved.

The semiconductor device of the present invention includes a silicon substrate of a first conductivity type, including a first surface and a second surface opposite the first surface; a silicon layer of a second conductivity type, arranged on the first surface of the silicon substrate, including a third surface opposite a junction surface with the silicon substrate; a first electrode arranged on the second surface; a second electrode arranged on the third surface; and an argon added area formed in a semiconductor area formed of the silicon substrate and the silicon layer, wherein the argon added area includes an area indicating an argon concentration of a minimum of $1\times10^{18}$ cm$^{-3}$ and a maximum of $1\times10^{20}$ cm$^{-3}$, and the silicon substrate includes a beta iron silicide area formed from the first surface to the inside of the silicon substrate. The argon added area may be formed from the third surface to the inside of the semiconductor area, or from the first surface to the inside of the silicon substrate.

Thus, the semiconductor device of the present invention includes the argon added area that includes an area indicating an argon concentration of a minimum of $1\times10^{18}$ cm$^{-3}$ and a maximum of $1\times10^{20}$ cm$^{-3}$. As a result of intensive studies, the inventor has found that the arrangement of an argon added area that includes an argon concentration of a minimum of $1\times10^{18}$ cm$^{-3}$ and a maximum of $1\times10^{20}$ cm$^{-3}$ leads to improvement in the EL intensity and the PL intensity, as compared to a semiconductor device to which no argon is added. Therefore, according to the semiconductor device of the present invention, the EL intensity and the PL intensity are improved.

The semiconductor device of the present invention includes a silicon substrate having a first surface, including an argon added area to which argon is added, wherein the silicon substrate includes a beta iron silicide area formed from the first surface to the inside of the silicon substrate, and the argon added area includes an area indicating an argon concentration of a minimum of $1\times10^{18}$ cm$^{-3}$ and a maximum of $1\times10^{20}$ cm$^{-3}$, and may be formed from the first surface to the inside of the silicon substrate.

Thus, the semiconductor device of the present invention includes the argon added area that includes the area indicating an argon concentration of a minimum of $1\times10^{18}$ cm$^{-3}$ and a maximum of $1\times10^{20}$ cm$^{-3}$. As a result of intensive studies, the inventor has found that the arrangement of an argon added area that includes an argon concentration of a minimum of $1\times10^{18}$ cm$^{-3}$ and a maximum of $1\times10^{20}$ cm$^{-3}$ leads to improvement in the PL intensity, as compared to a semiconductor device to which no argon is added. Therefore, according to the semiconductor device of the present invention, the PL intensity is improved.

According to the present invention, the light-emission intensity of the silicon semiconductor device is improved.

BRIEF DESCRIPTION OF THE DRAWINGS

FIG. 3A and FIG. 3B are graphs showing light-emission characteristics of the silicon semiconductor device according to the embodiment.

FIG. 4A, FIG. 4B, FIG. 4C, FIG. 4D, and FIG. 4E are cross-sections for describing a method for producing the silicon semiconductor device according to the embodiment.

FIG. 5A, FIG. 5B, and FIG. 5C are graphs for describing argon adding conditions according to the embodiment.

FIG. 6A, FIG. 6B, FIG. 6C, FIG. 6D, and FIG. 6E are cross-sections for describing a method for producing a silicon semiconductor device according to the embodiment.

FIG. 7A and FIG. 7B are cross-sections for describing a method for producing a silicon semiconductor device according to the embodiment.

FIG. 8A, FIG. 8B, and FIG. 8C are cross-sections showing structures of silicon semiconductor devices according to embodiments, and FIG. 8D, FIG. 8E, and FIG. 8F are graphs showing concentration distributions in a depth direction.

FIG. 11A, FIG. 11B, FIG. 11C, FIG. 11D, and FIG. 11E are cross-sections for describing a method for producing the silicon semiconductor device according to the embodiment.

FIG. 12A, FIG. 12B, FIG. 12C, FIG. 12D, and FIG. 12E are cross-sections for describing a method for producing the silicon semiconductor device according to the embodiment.

FIG. 13A and FIG. 13B are cross-sections for describing a method for producing the silicon semiconductor device according to the embodiment.

DESCRIPTION OF THE PREFERRED EMBODIMENTS

Figure 2A:
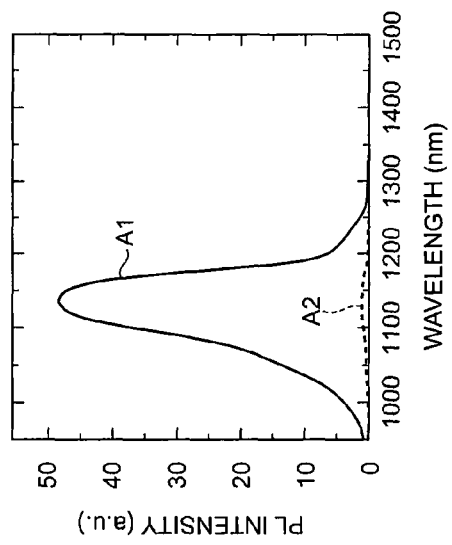
FIG. 2A and FIG. 2B are graphs showing light-emission characteristics of the silicon semiconductor device according to the embodiment.

Hereinafter, with reference to the drawings, a semiconductor device which is one example of a preferred embodiment, to which the present invention is applied, will be described in detail. It is noted that in the descriptions of the drawings, identical components are designated by the same reference numerals to omit overlapping description, where possible.

First Embodiment

Figure 1D:
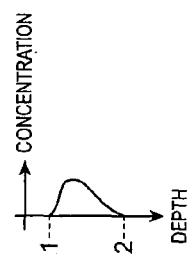
FIG. 1D, FIG. 1E, and FIG. 1F are graphs showing concentration distributions in a depth direction.

Based on FIG. 1A and FIG. 1D, a configuration of a silicon semiconductor device 1a according to a first embodiment will be described.

Figure 1E:
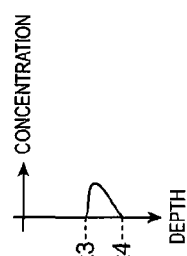
Figure 1F:
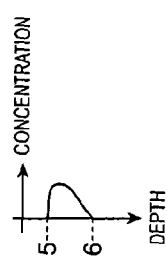
Figure 1A:
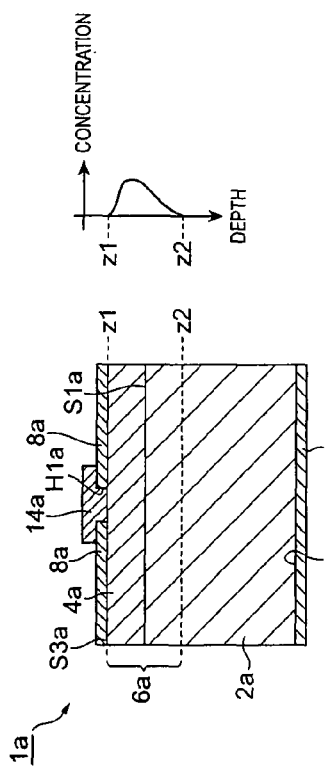
FIG. 1A, FIG. 1B, and FIG. 1C are cross-sections showing structures of silicon semiconductor devices according to the embodiments.

FIG. 1A is a cross-sections showing the configuration of the silicon semiconductor device 1a. FIG. 1D is a graph showing an argon concentration profile in the silicon semiconductor device 1a, in which a horizontal axis indicates an argon concentration and a vertical axis indicates a depth from a surface. As shown in FIG. 1A, the silicon semiconductor device 1a is an LED provided with: a silicon substrate 2a; a silicon layer 4a; an argon added area 6a; a passivation film 8a; a contact hole H1a; a first electrode 12a; and a second electrode 14a.

The silicon substrate 2a includes a first surface S1a and a second surface S2a opposite the first surface S1a. The silicon substrate 2a contains an impurity that indicates a first conductivity type. The silicon layer 4a contains an impurity that indicates a second conductivity type different from the first conductivity type, and is arranged on the first surface S1a of the silicon substrate 2a. A pn junction portion is formed by the silicon substrate 2a and the silicon layer 4a. The silicon layer 4a includes a third surface S3a opposite a junction surface with the silicon substrate 2a. The thickness of the silicon layer 4a is approximately 50 nm to several μm. In the first embodiment, the first conductivity type is an n-type, and the second conductivity type is a p-type. However, the first conductivity type may be the p-type, and the second conductivity type may be the n-type.

The argon added area 6a is an area to which argon (Ar) is added, and is formed in a semiconductor area formed of the silicon substrate 2a and the silicon layer 4a. The argon added area 6a is formed from the third surface S3a of the silicon layer 4a to the inside of the above-described semiconductor area. In FIG. 1D, the argon concentration profile in the argon added area 6a is shown. As shown in FIG. 1D, the argon concentration has its peak in the vicinity of the third surface S3a. The argon is distributed from a surface depth position z1 of the silicon layer 4a to a depth position z2 within the silicon substrate 2a. The argon added area 6a includes an area indicating an argon concentration of $1 \times 10^{18}$ cm$^{-1}$ to $2 \times 10^{20}$ cm$^{-3}$. The argon added area 6a preferably includes an area indicating an argon concentration of $2 \times 10^{18}$ cm$^{-3}$ to $1 \times 10^{20}$ cm$^{-3}$. In an example shown in FIG. 1A, the argon added area 6a reaches from the third surface S3a of the silicon layer 4a to the interior of the silicon substrate 2a.

The passivation film 8a is a silicon oxide film, for example, and is arranged on the third surface S3a of the silicon layer 4a. The contact hole H1a is arranged in the passivation film 8a to expose the third surface S3a of the silicon layer 4a. The first electrode 12a is a conductive metal (aluminum or the like, for example), and is arranged on the second surface S2a of the silicon substrate 2a. The second electrode 14a is arranged on the passivation film 8a (on the third surface S3a), and is electrically connected via the contact hole H1a to the silicon layer 4a. The second electrode 14a is a conductive metal (aluminum or the like, for example). In the silicon semiconductor device 1a having the above-described configuration, when a bias voltage is applied to the second electrode 14a and the first electrode 12a, light emission is caused in the argon added area 6a.

Figure 2B:
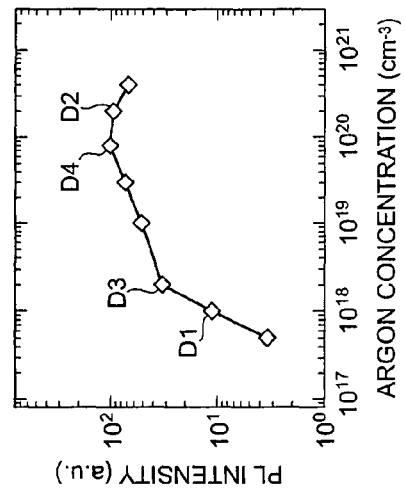

Subsequently, with reference to FIG. 2A, FIG. 2B, FIG. 3A, and FIG. 3B, light-emission characteristics of the silicon semiconductor device 1a according to the first embodiment will be described. FIG. 2A and FIG. 2B show data indicating a PL (Photo Luminescence) light-emission characteristics of the silicon semiconductor device 1a. Both the data shown in FIG. 2A and FIG. 2B are the data measured at room temperature. FIG. 2A shows data (data indicated by reference numeral A1 in the graph) showing a correlation between a wavelength of the PL light emission and a PL intensity in the silicon semiconductor device 1a of which the argon concentration is approximately $1 \times 10^{19}$ cm$^{-3}$. FIG. 2A also shows data (data indicated by reference numeral A2 in the graph) showing a correlation between a wavelength of the PL light emission and a PL intensity in a silicon to which no argon is added. A horizontal axis of the graph shown in FIG. 2A represents a wavelength (nm) of the PL light emission, and a vertical axis thereof represents a PL intensity (arb. units). The PL intensity was measured at room temperature, in which an Nd:YVO4 laser of 532 nm was used as an excitation and an infrared photomultiplier (Hamamatsu Photonics R5509-72) was used for detection. According to the data shown in FIG. 2A, the intensity (A1) of the PL light emission (1.13 μm band) of the silicon semiconductor device 1a of which the argon concentration is approximately $1 \times 10^{19}$ cm$^{-3}$ increases by 50 times or more than the intensity (A2) of the PL light emission (1.13 μm band) of the silicon element to which no argon is added. Thus, in the silicon semiconductor device 1a of which the argon concentration is approximately $1 \times 10^{19}$ cm$^{-3}$, the PL intensity is significantly improved.

FIG. 2B shows a correlation between the argon concentration of the silicon semiconductor device 1a and the PL intensity in the 1.13 μm band. A horizontal axis of the graph shown in FIG. 2B represents the argon concentration (cm$^{-3}$), and a vertical axis thereof represents the PL intensity (arb. units) in the 1.13 μm band. According to the data shown in FIG. 2B, when the PL intensity in a case where no argon is added is "1" (units), the PL intensity of which the argon concentration is in a range of $1 \times 10^{18}$ cm$^{-3}$ (see data of reference numeral D1 in the graph) to $2 \times 10^{20}$ cm$^{-3}$ (see data of reference numeral D2 in the graph) increases by 10 times to 100 times or more, as compared to a case where no argon is added. Thus, the PL intensity is significantly improved when the argon concentration is in a range of $1 \times 10^{18}$ cm$^{-3}$ to $2 \times 10^{20}$ cm$^{-3}$. In particular, the PL intensity of which the argon concentration is in a range of $2 \times 10^{18}$ cm$^{-3}$ (see data of reference numeral D3 in the graph) to $1 \times 10^{20}$ cm$^{-3}$ (see data of reference numeral D4 in the graph) increases by 30 times to 100 times or more, as compared to a case where no argon is added. When the concentration is within ±50% of the concentration of D4, at least the PL intensity is significantly increased. Thus, the PL intensity is significantly improved when the argon concentration is in a range of $2 \times 10^{18}$ cm$^{-3}$ to $1 \times 10^{20}$ cm$^{-3}$.

FIG. 3A and FIG. 3B show data indicating EL (Electric Luminescence) light-emission characteristics of the silicon semiconductor device 1a. Both the data shown in FIG. 3A and FIG. 3B are measured at room temperature. FIG. 3A shows data (data indicated by reference numeral A3 in the graph) showing a correlation between a wavelength of the EL light emission and the EL intensity in the silicon semiconductor device 1a of which the argon concentration is approximately $2 \times 10^{19}$ cm$^{-3}$. FIG. 3A also shows data (data indicated by reference numeral A4 in the graph, and this data is obtained by magnifying the actual data by 100 times) showing a correlation between a wavelength of an EL light emission and an EL intensity in a silicon to which no argon is added. A horizontal axis of the graph shown in FIG. 3A represents the wavelength (nm) of the EL light emission, and a vertical axis thereof represents the EL intensity (arb. units). The EL intensity was measured at room temperature, in which a pulse power supply of 100 Hz (implantation current density was 2 A/cm$^{-3}$) was used, and an infrared photomultiplier (Hamamatsu Photonics R5509-72) was used for detection. According to the data shown in FIG. 3A, the EL intensity (1.1 μm band) of the silicon semiconductor device 1a of which the argon concentration is approximately $2 \times 10^{19}$ cm$^{-3}$ increases by approximately 2000 times than the EL intensity (1.1 μm band) to which no argon is added. Thus, in the silicon semiconductor device 1a of which the argon concentration is approximately $2 \times 10^{19}$ cm$^{-3}$, the EL intensity is significantly improved.

FIG. 3B shows a correlation between the argon concentration of the silicon semiconductor device 1a and the EL intensity in the 1.13 μm band. A horizontal axis of the graph shown in FIG. 3B represents the argon concentration (cm$^{-3}$), and a vertical axis thereof represents the EL intensity (arb. units) in the 1.13 μm band. According to the data shown in FIG. 3B, when the EL intensity in a case where no argon is added is "1" (units), the EL intensity when the argon concentration is in a range of $1 \times 10^{18}$ cm$^{-3}$ (see data of reference numeral D5 in the graph) to $2 \times 10^{20}$ cm$^{-3}$ (see data of reference numeral D6 in the graph) increases by 200 times to 2000 times or more, as compared to a case where no argon is added. As described above, the EL intensity is significantly improved when the argon concentration is in a range of $1 \times 10^{18}$ cm$^{-3}$ to $2 \times 10^{20}$ cm$^{-3}$.

In particular, the EL intensity when the argon concentration is in a range of $2 \times 10^{18}$ cm$^{-3}$ (see data of reference numeral D7 in the graph) to $1 \times 10^{20}$ cm$^{-3}$ (see data of reference numeral D8 in the graph) increases by 1000 times to 2000 times or more, as compared to a case where no argon is added. When the concentration is within ±50% of the concentration of D8, at least the EL intensity is significantly increased. Thus, the EL intensity is significantly improved when the argon concentration is in a range of $2 \times 10^{18}$ cm$^{-3}$ to $1 \times 10^{20}$ cm$^{-3}$. Therefore, according to the data shown in FIG. 2A, FIG. 2B, FIG. 3A, and FIG. 3B, the argon concentration of the silicon semiconductor device 1a preferably is in a range of $1 \times 10^{18}$ cm$^{-3}$ to $2 \times 10^{20}$ cm$^{-3}$, and more preferably in a range of $2 \times 10^{18}$ cm$^{-3}$ to $1 \times 10^{20}$ cm$^{-3}$.

Further, the inventor confirms that a response speed of the EL light emission of the silicon semiconductor device 1a of which the argon concentration is in a range of $2 \times 10^{18}$ cm$^{-3}$ to $1 \times 10^{20}$ cm$^{-3}$ reaches approximately 20 ns from 1 μs or greater, which is approximately 50 times faster as compared to the silicon to which no argon is added.

Subsequently, with reference to FIG. 4A to FIG. 4E, a process for producing the silicon semiconductor device 1a according to the first embodiment will be described. First, the silicon substrate 2a is prepared (FIG. 4A). The silicon layer 4a is next formed on the first surface S1a of the silicon substrate 2a (FIG. 4B). The thickness of the silicon layer 4a is approximately 50 nm to several μm. By using an HIP (Hot Isostatic Pressing) device, argon is then added from the third surface S3a of the silicon layer 4a. In this case, the silicon substrate 2a is mounted on a substrate-loading base within the HIP device. The second surface S2a of the silicon substrate 2a is in contact with the surface of the base. The third surface S3a is exposed for 30 minutes to 6 hours to an argon-containing atmosphere which is adjusted to temperatures of 400° C. to 900° C. and pressures of 4 MPa to 200 MPa. Thereby, the argon is added from the third surface S3a. The addition of the argon forms the argon added area 6a (FIG. 4C). Argon adding conditions are: pressures of 4 MPa to 200 MPa under the argon atmosphere; temperatures of 400° C. to 900° C.; and a processing time of 30 minutes to 6 hours. As the argon adding method, any method such as an ion implantation method, a sputtering method, or the like, may be used.

Subsequently, a passivation film 81 is formed on the third surface S3a of the silicon layer 4a (FIG. 4D). Next, the contact hole H1a is provided on the passivation film 81 to form the passivation film 8a, and the second electrode 14a is formed on the passivation film 8a and the first electrode 12a is formed on the second surface S2a of the silicon substrate 2a. Thereafter, through a process such as dicing, the silicon semiconductor device 1a is produced (FIG. 4E).

FIG. 5A, FIG. 5B, and FIG. 5C show correlations between the argon adding conditions (pressure, temperature, and processing time) and the PL intensity. FIG. 5A shows a correlation between the pressures in the argon atmosphere and the PL intensity, under argon adding conditions in which a temperature is approximately 800° C. and a processing time is approximately 6 hours. A horizontal axis of the graph shown in FIG. 5A represents a pressure (MPa), and a vertical axis thereof represents a PL intensity (arb. units). As shown in FIG. 5A, when the PL intensity in a case where a pressure is approximately as high as an atmospheric pressure is "2" (units) (see data of reference numeral D9 in the graph), if the argon is added under argon adding conditions in which a temperature is approximately 800° C.; pressures are approximately 4 MPa (see data of reference numeral D10 in the graph) to 200 MPa (see data of reference numeral D11 in the graph) (or a pressure is 4 MPa or more); and a processing time is approximately 6 hours, the PL intensity increases by approximately 13 times to 63 times, as compared to a case where the pressure is approximately as high as the atmospheric pressure. F According to the data shown in FIG. 5A, when the pressure is higher, the PL intensity increases as well.

FIG. 5B shows a correlation between the temperature in the argon atmosphere and the PL intensity, under argon adding conditions in which a pressure is approximately 180 MPa and a processing time is approximately 6 hours. A horizontal axis of the graph shown in FIG. 5B represents a temperature (Celsius), and a vertical axis thereof represents a PL intensity (arb. units). As shown in FIG. 5B, the argon preferably is added under argon adding conditions, in which temperatures are approximately 400° C. (see data of reference numeral D12 in the graph) to approximately 900° C. (see data of reference numeral D13 in the graph) (or a temperature is 400° C. or more); a pressure is approximately 180 MPa; and a processing time is approximately 6 hours. The argon more preferably is added under argon adding conditions, in which temperatures are approximately 600° C. (see data of reference numeral D14 in the graph) to approximately 900° C. (see data of reference numeral D13 in the graph); a pressure is approximately 180 MPa; and a processing time is approximately 6 hours.

FIG. 5C shows a correlation between the processing time and the PL intensity under argon adding conditions, in which a pressure is approximately 180 MPa and a temperature is approximately 800° C. A horizontal axis of the graph shown in FIG. 5C represents a processing time (hour), and a vertical axis thereof represents a PL intensity (arb. units). According to the data shown in FIG. 5C, when the processing time is longer, the PL intensity also increases, under the argon adding conditions in which a temperature is approximately 800° C. and a pressure is approximately 180 MPa. In particular, when the processing time is 2 hours or longer (see each data of reference numerals D15, D16, and D17 in the graph), the PL intensity is high.

Second Embodiment

Figure 1B:
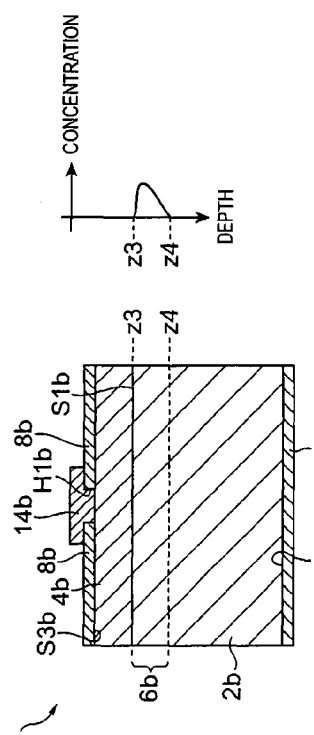

Based on FIG. 1B and FIG. 1E, a configuration of a silicon semiconductor device 1b will be described. FIG. 1B is a cross-sections showing the configuration of the silicon semiconductor device 1b. FIG. 1E is a graph showing an argon concentration profile in the silicon semiconductor device 1b, in which a horizontal axis indicates an argon concentration and a vertical axis indicates a depth from a surface. As shown in FIG. 1B, the silicon semiconductor device 1b is an LED provided with: a silicon substrate 2b; a silicon layer 4b; an argon added area 6b; a passivation film 8b; a contact hole H1b; a first electrode 12b; and a second electrode 14b.

The silicon substrate 2b includes a first surface S1b and a second surface S2b opposite the first surface S1b. The silicon substrate 2b contains an impurity that indicates a first conductivity type. The silicon layer 4b contains an impurity that indicates a second conductivity type different from the first conductivity type, and is arranged on the first surface S1b of the silicon substrate 2b. A pn junction portion is formed by the silicon substrate 2b and the silicon layer 4b. The silicon layer 4b includes a third surface S3b opposite a junction surface with the silicon substrate 2b. The thickness of the silicon layer 4b is approximately 50 nm to several μm. In the second embodiment, the first conductivity type is an n-type and the second conductivity type is a p-type. However, the first conductivity type may be the p-type and the second conductivity type may be the n-type.

The argon added area 6b is an area to which argon is added, and is formed in a semiconductor area formed of the silicon substrate 2b and the silicon layer 4b. The argon added area 6b is formed from the first surface S1b of the silicon substrate 2b to the inside of the silicon substrate 2b. In FIG. 1E, the argon concentration profile in the argon added area 6b is shown. The argon is distributed from a depth position z3 of an interface S1b to a depth position z4 within the silicon substrate 2b. As shown in FIG. 1E, the argon concentration has its peak in the vicinity of the first surface S1b. The argon added area 6b includes an area indicating an argon concentration of $1 \times 10^{18}$ $cm^{-3}$ to $2 \times 10^{20}$ $cm^{-3}$. The argon added area 6b more preferably includes an area indicating an argon concentration of $2 \times 10^{18}$ $cm^{-3}$ to $1 \times 10^{20}$ $cm^{-3}$.

The passivation film 8b is a silicon oxide film, for example, and is arranged on the third surface S3b of the silicon layer 4b. The contact hole H1b is arranged in the passivation film 8b to expose the third surface S3b of the silicon layer 4b. The first electrode 12b is a conductive metal (aluminum or the like, for example), and is arranged on the second surface S2b of the silicon substrate 2b. The second electrode 14b is arranged on the passivation film 8b (on the third surface S3b), and is electrically connected via the contact hole H1b to the silicon layer 4b. The second electrode 14b is a conductive metal (aluminum or the like, for example). In the silicon semiconductor device 1b having the above-described configuration, when a bias voltage is applied to the second electrode 14b and the first electrode 12b, light emission is caused in the argon added area 6b.

Light-emission characteristics of the silicon semiconductor device 1b according to the second embodiment are similar to that of the silicon semiconductor device 1a according to the above-described first embodiment (that is, the light-emission characteristics shown in FIG. 2A, FIG. 2B, FIG. 3A, and FIG. 3B). Thus, a description of the light-emission characteristics of the silicon semiconductor device 1b is omitted.

Subsequently, with reference to FIG. 6A, FIG. 6B, FIG. 6C, FIG. 6D, FIG. 6F, and FIG. 6E, a process for producing the silicon semiconductor device 1b according to the second embodiment will be described. First, the silicon substrate 2b is prepared (FIG. 6A). By using the HIP device, the argon is then added from the first surface S1b of the silicon substrate 2b. In this case, the silicon substrate 2b is mounted on a substrate-loading base within the HIP device. The second surface S2b of the silicon substrate 2b is in contact with the surface of the base. The first surface S1b is exposed for 30 minutes to 6 hours to an argon-containing atmosphere which is adjusted to temperatures of 400° C. to 900° C. and pressures of 4 MPa to 200 MPa. Thereby, the argon is added from the first surface S1b. The addition of the argon forms the argon added area 6b (FIG. 6B). Argon adding conditions are: pressures of 4 MPa to 200 MPa under the argon atmosphere; temperatures of 400° C. to 900° C.; and a processing time of 30 minutes to 6 hours. As the argon adding method, any method such as an ion implantation method, a sputtering method, or the like, may be used.

The silicon layer 4b is next formed on the first surface S1b of the silicon substrate 2b (FIG. 6C). The thickness of the silicon layer 4b is approximately 50 nm to several μm. Subsequently, a passivation film 82 is formed on the third surface S3b of the silicon layer 4b (FIG. 6D). Next, the contact hole H1b is arranged in the passivation film 82 to form the passivation film 8b, and the second electrode 14b is formed on the passivation film 8b and the first electrode 12b is formed on the second surface S2b of the silicon substrate 2b. Thereafter, through a process such as dicing, the silicon semiconductor device 1b is produced (FIG. 6E).

A correlation between the argon adding conditions (pressure, temperature, and processing time) and the PL intensity according to the second embodiment is similar to that between the argon adding conditions (pressure, temperature, and processing time) and the PL intensity according to the above-described first embodiment (that is, the correlations shown in FIG. 5A to FIG. 5C). Thus, a description of the correlation between the argon adding conditions (pressure, temperature, and processing time) and the PL intensity according to the second embodiment is omitted.

Third Embodiment

Figure 1C:
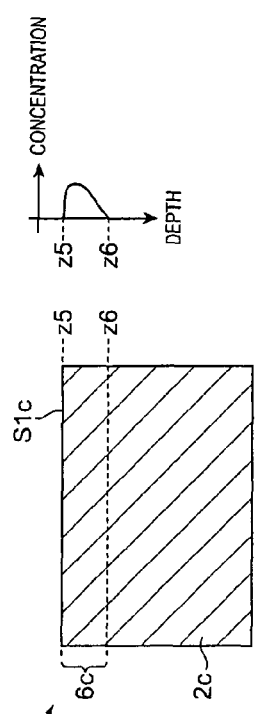

Based on FIG. 1C and FIG. 1F, a configuration of a semiconductor device 1c will be described. FIG. 1C is a cross-section showing the configuration of the semiconductor device 1c. FIG. 1F is a graph showing an argon concentration profile in the semiconductor device 1c, in which a horizontal axis indicates an argon concentration and a vertical axis indicates a depth from a surface. As shown in FIG. 1C, the silicon semiconductor device 1c is provided with a silicon substrate 2c and an argon added area 6c.

The silicon substrate 2c has a first surface S1c, and includes the argon added area 6c. The argon added area 6c is an area, to which the argon is added, arranged within the silicon substrate 2c. The argon added area 6c is formed from the first surface S1c of the silicon substrate 2c to the inside of the silicon substrate 2c. In FIG. 1F, the argon concentration profile in the argon added area 6c is shown. The argon is distributed from an exposed-surface position z5 of the silicon substrate 2c to a depth position z6 within the silicon substrate 2c. As shown in FIG. 1F, the argon concentration has its peak in the vicinity of the first surface S1c. The argon added area 6c includes an area indicating an argon concentration of $1\times10^{18}$ cm$^{-3}$ to $2\times10^{20}$ cm$^{-3}$. The argon added area 6c more preferably includes an area indicating an argon concentration of $2\times10^{18}$ cm$^{-3}$ to $1\times10^{20}$ cm$^{-3}$.

Light-emission characteristics of a PL light emission of the silicon semiconductor device 1c according to the third embodiment are similar to that of the silicon semiconductor device 1a according to the above-described first embodiment (that is, the light-emission characteristics shown in FIG. 2A and FIG. 2B). Thus, a description of the light-emission characteristics regarding the PL light emission of the silicon semiconductor device 1c is omitted.

Subsequently, with reference to FIG. 7A and FIG. 7B, a process for producing the silicon semiconductor device 1c according to the third embodiment will be described. First, the silicon substrate 2c is prepared (FIG. 7A). By using the HIP device, the argon is then added from the first surface S1c of the silicon substrate 2c. In this case, the silicon substrate 2c is mounted on a substrate-loading base within the HIP device. A surface opposite the first surface S1c of the silicon substrate 2c is in contact with the surface of the base. Then, the first surface S1c is exposed for 30 minutes to 6 hours to an argon-containing atmosphere which is adjusted to temperatures of 400° C. to 900° C. and pressures of 4 MPa to 200 MPa. Thereby, the argon is added from the first surface S1c. The addition of the argon forms the argon added area 6c. Argon adding conditions are: pressures of 4 MPa to 200 MPa under the argon atmosphere; temperatures of 400° C. to 900° C.; and a processing time of 30 minutes to 6 hours. As the argon adding method, any method such as an ion implantation method, a sputtering method, or the like, may be used. Thereafter, through a process such as dicing, the silicon semiconductor device 1c is produced (FIG. 7B).

A correlation between the argon adding conditions (pressure, temperature, and processing time) and the PL intensity according to the third embodiment is similar to that between the argon adding conditions (pressure, temperature, and processing time) and the PL intensity according to the first embodiment (that is, the correlations shown in FIG. 5A, FIG. 5B, and FIG. 5C). Thus, the correlation between the argon adding conditions (pressure, temperature, and processing time) and the PL intensity according to the third embodiment is omitted.

Fourth Embodiment

Based on FIG. 8A and FIG. 8D, a configuration of a silicon semiconductor device 1d will be described. FIG. 8A is a cross-section showing the configuration of the silicon semiconductor device 1d. FIG. 8D is a graph showing an argon concentration profile in the silicon semiconductor device 1d, in which a horizontal axis indicates an argon concentration and a vertical axis indicates a depth from a surface. As shown in FIG. 8A, the silicon semiconductor device 1d is an LED provided with: a silicon substrate 2d; a silicon area 3d; a silicon layer 4d; an argon added area 6d; a passivation film 8d; a contact hole H1d; a first electrode 12d; and a second electrode 14d.

The silicon substrate 2d includes a first surface S1d and a second surface S2d opposite the first surface S1d. The silicon substrate 2d includes an impurity that indicates a first conductivity type. The silicon substrate 2d includes the silicon area 3d. The silicon area 3d is arranged so as to have a thickness inwardly from the first surface S1d of the silicon substrate 2d. The silicon area 3d contains an impurity that indicates the first conductivity type, and is configured of either one of porous silicon or beta iron silicide ($\beta$-FeSi$_2$). The remaining area, other than the silicon area 3d, of the silicon substrate 2d is formed of single crystal silicon, for example. The silicon layer 4d contains an impurity that indicates a second conductivity type different from the first conductivity type, and is arranged on the first surface S1d of the silicon substrate 2d. A pn junction portion is formed by the silicon substrate 2d (in particular, the silicon area 3d) and the silicon layer 4d. The silicon layer 4d includes a third surface S3d opposite a junction surface with the silicon substrate 2d. The thickness of the silicon layer 4d is approximately 50 nm to several μm. In the fourth embodiment, when the silicon area 3d is configured of the porous silicon, the first conductivity type is a p type and the second conductivity type is an n type; and when the silicon area 3d is configured of the beta iron silicide, the first conductivity type is the n type and the second conductivity type is the p type. On the contrary, when the silicon area 3d is configured of the porous silicon, it may be possible that the first conductivity type is the n type and the second conductivity type is the p type; and when the silicon area 3d is configured of the beta iron silicide, it may be possible that the first conductivity type is the p type and the second conductivity type is the n type.

The argon added area 6d is an area to which the argon is added, and is formed in a semiconductor area formed of the silicon substrate 2d and the silicon layer 4d. The argon added area 6d is formed from the third surface S3d of the silicon layer 4d to inside the above-described semiconductor area. In FIG. 8D, the argon concentration profile in the argon added area 6d is shown. The argon is distributed from an exposed-surface position z7 of the silicon layer 4d to a depth position z8 that is deeper than the silicon area 3d within the silicon substrate 2d. As shown in FIG. 8D, the argon concentration has its peak in the vicinity of the third surface S3d. When the silicon area 3d is configured of the porous silicon, the argon added area 6d includes an area that indicates an argon concentration of $1 \times 10^{18}$ cm$^{-3}$ to $2 \times 10^{20}$ cm$^{-3}$. The argon added area 6d preferably includes an area indicating an argon concentration of $2 \times 10^{18}$ cm$^{-3}$ to $1 \times 10^{20}$ cm$^{-3}$. When the silicon area 3d is configured of the beta iron silicide, the argon added area 6d includes an area that indicates an argon concentration of $1 \times 10^{18}$ cm$^{-3}$ to $1 \times 10^{20}$ cm$^{-3}$. The argon added area 6d more preferably includes an area indicating an argon concentration of $2 \times 10^{18}$ cm$^{-3}$ to $1 \times 10^{20}$ cm$^{-3}$. In an example shown in FIG. 8A, the argon added area 6d includes, from the third surface S3d of the silicon layer 4d, the silicon layer 4d and the silicon area 3d to reach the interior of the silicon substrate 2d.

The passivation film 8d is a silicon oxide film, for example, and is arranged on the third surface S3d of the silicon layer 4d. The contact hole H1d is arranged in the passivation film 8d to expose the third surface S3d of the silicon layer 4d. The second electrode 14d is arranged on the passivation film 8d (on the third surface S3d), and is electrically connected via the contact hole H1d to the silicon layer 4d. The second electrode 14d is a conductive metal (aluminum or the like, for example). The first electrode 12d is a conductive metal (aluminum or the like, for example), and is arranged on the second surface S2d of the silicon substrate 2d. In the silicon semiconductor device 1d having the above-described configuration, when a bias voltage is applied to the second electrode 14d and the first electrode 12d, light emission is caused in the argon added area 6d.

Figure 9A:
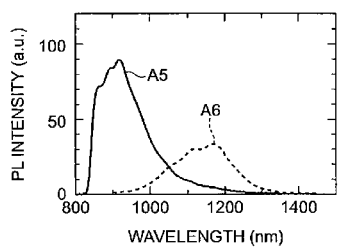
FIG. 9A and FIG. 9B are graphs showing light-emission characteristics of the silicon semiconductor device according to the embodiment.
Figure 9B:
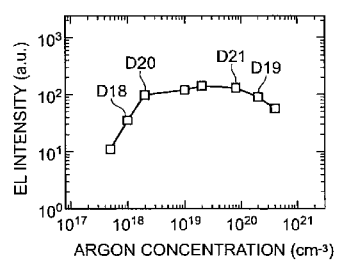

Subsequently, with reference to FIG. 9A, FIG. 9B, FIG. 10A, and FIG. 10B, light-emission characteristics of the silicon semiconductor device 1d according to the fourth embodiment will be described. FIG. 9A shows data indicating PL light-emission characteristics of the silicon semiconductor device 1d having the silicon area 3d configured of the porous silicon, and FIG. 9B shows data indicating EL light-emission characteristics of the silicon semiconductor device 1d having the silicon area 3d configured of the porous silicon. Both the data shown in FIG. 9A and FIG. 9B are measured at room temperature. FIG. 9A shows data (data indicated by reference numeral A5 in the graph) indicating a correlation between a wavelength of the PL light emission and a PL intensity in the silicon semiconductor device 1d of which the argon concentration is approximately $1 \times 10^{19}$ cm$^{-3}$. FIG. 9A also shows data (data indicated by reference numeral A6 in the graph, and this data is obtained by magnifying the actual data by 50 times) indicating a correlation between a wavelength of the PL light emission and a PL intensity in a silicon to which no argon is added. A horizontal axis of the graph shown in FIG. 9A represents a wavelength (nm) of the PL light emission, and a vertical axis thereof represents a PL intensity (arb. units). According to the data shown in FIG. 9A, the PL intensity (0.92 μm band) of the silicon semiconductor device 1d of which the argon concentration is approximately $1 \times 10^{19}$ cm$^{-3}$ increases by 100 times or more than the PL intensity (0.92 μm band) of the silicon element to which no argon is added. As described above, in the silicon semiconductor device 1d of which argon concentration is approximately $1 \times 10^{19}$ cm$^{-3}$, the PL intensity is significantly improved.

In the silicon element to which no argon is added, a peak of the PL light emission is approximately 1150 nm. However, in the silicon semiconductor device 1d of which the argon concentration is approximately $1 \times 10^{19}$ cm$^{-3}$, the peak shifts to approximately 922 nm. FIG. 9B shows a correlation between the argon concentration of the silicon semiconductor device 1d and an EL intensity in a 922 nm band. A horizontal axis of the graph shown in FIG. 9B represents the argon concentration (cm$^{-3}$), and a vertical axis thereof represents the EL intensity (arb. units). According to the data shown in FIG. 9B, when the EL intensity in a case where no argon is added is "1" (units), the PL intensity of which the argon concentration is in a range of $1 \times 10^{18}$ cm$^{-3}$ (see data of reference numeral D18 in the graph) to $2 \times 10^{20}$ cm$^{-3}$ (see data of reference numeral D19 in the graph) increases by 30 times to 100 times or more, as compared to a case where no argon is added. As described above, the EL intensity is significantly improved when the argon concentration is in a range of $1 \times 10^{18}$ cm$^{-3}$ and $2 \times 10^{20}$ m$^{-3}$.

In particular, the EL intensity when the argon concentration is in a range of $2 \times 10^{18}$ cm$^{-3}$ (see data of reference numeral D20 in the graph) to $8 \times 10^{19}$ cm$^{-3}$ (see data of reference numeral D21 in the graph) increases by 100 times or more, as compared to a case where no argon is added. As described above, the EL intensity is significantly improved when the argon concentration is in a range of $2 \times 10^{18}$ cm$^{-3}$ to $8 \times 10^{19}$ cm$^{-3}$. Therefore, the argon concentration of the silicon semiconductor device 1d in which the porous silicon is used preferably is in a range of $1 \times 10^{18}$ cm$^{-3}$ to $2 \times 10^{20}$ cm$^{-3}$, and more preferably in a range of $2 \times 10^{18}$ cm$^{-3}$ to $8 \times 10^{19}$ cm$^{-3}$.

Figure 10A:
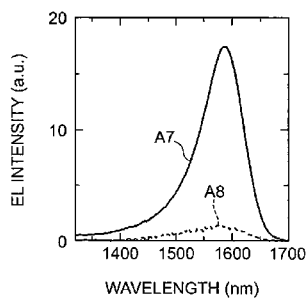
FIG. 10A and FIG. 10B are graphs showing light-emission characteristics of the silicon semiconductor device according to the embodiment.
Figure 10B:
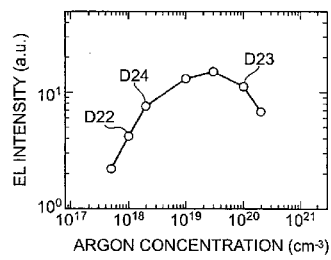

FIG. 10A and FIG. 10B show data indicates EL (Electric Luminescence) light-emission characteristics of the silicon semiconductor device 1d having a silicon area 3d configured of the beta iron silicide. Both the data shown in FIG. 10A and FIG. 10B are measured at room temperature. FIG. 10A shows data (data indicated by reference numeral A7 in the graph) showing a correlation between a wavelength of the EL light emission and an EL intensity in the silicon semiconductor device 1d of which the argon concentration is approximately $1 \times 10^{19}$ cm$^{-3}$. FIG. 10A also shows data (data indicated by reference numeral A8 in the graph) showing a correlation between a wavelength of the EL light emission and an EL intensity in a silicon to which no argon is added. A horizontal axis of the graph shown in FIG. 10A represents a wavelength (nm) of the EL light emission, and a vertical axis thereof represents an EL intensity (arb. units). According to the data shown in FIG. 10A, the EL intensity (1.6 μm band) of the silicon semiconductor device 1d of which the argon concentration is approximately $1 \times 10^{19}$ cm$^{-3}$ increases by approximately 15 times than the EL intensity (1.6 μm band) of the silicon to which no argon is added. As described above, in the silicon semiconductor device 1d of which the argon concentration is approximately $1 \times 10^{19}$ cm$^{-3}$, the EL intensity is significantly improved.

FIG. 10B shows a correlation between the argon concentration of the silicon semiconductor device 1d and the EL intensity in a 1.6 μm band. A horizontal axis of the graph shown in FIG. 10B represents the argon concentration (cm$^{-3}$), and a vertical axis thereof represents the EL intensity (arb. units) in the 1.6 μm band. According to the data shown in FIG. 10B, when the EL intensity in a case where no argon is added is "1" (units), the EL intensity when the argon concentration is in a range of $1 \times 10^{18}$ cm$^{-3}$ (see data of reference numeral D22 in the graph) to $1 \times 10^{20}$ cm$^{-3}$ (see data of reference numeral D23 in the graph) increases by 4 times to 10 times or more, as compared to a case where no argon is added. As described above, the EL intensity is significantly improved when the argon concentration is in a range of $1 \times 10^{18}$ cm$^{-3}$ to $1 \times 10^{20}$ cm$^{-3}$.

In particular, the EL intensity when the argon concentration is in a range of $2 \times 10^{18}$ cm$^{-3}$ (see data of reference numeral D24 in the graph) to $1 \times 10^{20}$ cm$^{-3}$ (see data of reference numeral D23 in the graph) increases by 6 times to 10 times or more, as compared to a case where no argon is added. As describe above, the EL intensity is more significantly improved when the argon concentration is in a range of $2 \times 10^{18}$ cm$^{-3}$ to $1 \times 10^{20}$ cm$^{-3}$. Therefore, the argon concentration of the silicon semiconductor device 1$d$ including the beta iron silicide preferably is in a range of $1 \times 10^{18}$ cm$^{-3}$ to $1 \times 10^{20}$ cm$^{-3}$, and more preferably in a range of $2 \times 10^{18}$ cm$^{-3}$ to $1 \times 10^{20}$ cm$^{-3}$.

Subsequently, with reference to FIG. 11A, FIG. 11B, FIG. 11C, FIG. 11D, and FIG. 11E, a process for producing the silicon semiconductor device 1$d$ according to the fourth embodiment will be described. First, the silicon substrate 2$d$ is prepared (FIG. 11A). The silicon layer 4$d$ is next formed on the first surface S1$d$ of the silicon substrate 2$d$ (FIG. 11B). The thickness of the silicon layer 4$d$ is approximately 50 nm to several μm. By using the HIP device, the argon is then added from the third surface S3$d$ of the silicon layer 4$d$. In this case, the silicon substrate 2$d$ is mounted on a substrate-loading base within the HIP device. The second surface S2$d$ of the silicon substrate 2$d$ is in contact with the surface of the base. The third surface S3$d$ is exposed for 30 minutes to 6 hours to an argon-containing atmosphere which is adjusted to temperatures of 400° C. to 900° C. and pressures of 4 MPa to 200 MPa. Thereby, the argon is added from the third surface S3$d$. The addition of the argon forms the argon added area 6$d$ (FIG. 11C). Argon adding conditions are: pressures of 4 MPa to 200 MPa under the argon atmosphere; temperatures of 400° C. to 900° C.; and a processing time of 30 minutes to 6 hours. As the argon adding method, any method such as an ion implantation method, a sputtering method, or the like, may be used.

Subsequently, a passivation film 83 is formed on the third surface S3$d$ of the silicon layer 4$d$ (FIG. 11D). Next, the contact hole H1$d$ is arranged in the passivation film 83 to form the passivation film 8$d$, and the second electrode 14$d$ is formed on the passivation film 8$d$ and the first electrode 12$d$ is formed on the second surface S2$d$ of the silicon substrate 2$d$. Thereafter, through a process such as dicing or the like, the silicon semiconductor device 1$d$ is produced (FIG. 11E).

A correlation between the argon adding conditions (pressure, temperature, and processing time) and the PL intensity according to the fourth embodiment is similar to that between the argon adding conditions (pressure, temperature, and processing time) and the PL intensity according to the first embodiment (that is, the correlation shown in FIG. 5). Thus, a description of the correlation between the argon adding conditions (pressure, temperature, and processing time) and the PL intensity according to the fourth embodiment is omitted.

Fifth Embodiment

Based on FIG. 8B and FIG. 8E, a configuration of a silicon semiconductor device 1$e$ will be described. FIG. 8B is a cross-section showing the configuration of the silicon semiconductor device 1$e$. FIG. 8E is a graph showing an argon concentration profile in the silicon semiconductor device 1$e$, in which a horizontal axis indicates an argon concentration and a vertical axis indicates a depth from a surface. As shown in FIG. 8B, the silicon semiconductor device 1$e$ is an LED provided with: a silicon substrate 2$e$; a silicon area 3$e$; a silicon layer 4$e$; an argon added area 6$e$; a passivation film 8$e$; a contact hole H1$e$; a first electrode 12$e$; and a second electrode 14$e$.

The silicon substrate 2$e$ includes a first surface S1$e$ and a second surface S2$e$ opposite the first surface S1$e$. The silicon substrate 2$e$ contains an impurity that indicates a first conductivity type. The silicon substrate 2$e$ includes the silicon area 3$e$. The silicon area 3$e$ is arranged so as to have a thickness inwardly from the first surface S1$e$ of the silicon substrate 2$e$. The remaining area, other than the silicon area 3$e$, of the silicon substrate 2$e$ is formed of single crystal silicon, for example. The silicon area 3$e$ contains an impurity that indicates the first conductive type, and is configured of either one of porous silicon or beta iron silicide. The silicon layer 4$e$ contains an impurity that indicates a second conductivity type different from the first conductivity type, and is arranged on the first surface S1$e$ of the silicon substrate 2$e$. A pn junction portion is formed by the silicon substrate 2$e$ (in particular, the silicon area 3$e$) and the silicon layer 4$e$. The silicon layer 4$e$ includes a third surface S3$e$ opposite a junction surface with the silicon substrate 2$e$. The thickness of the silicon layer 4$e$ is approximately 50 nm to several μm. In the fifth embodiment, when the silicon area 3$e$ is configured of the porous silicon, the first conductivity type is a p type and the second conductivity type is an n type; and when the silicon area 3$e$ is configured of the beta iron silicide, the first conductivity type is the n type and the second conductivity type is the p type. On the contrary, when the silicon area 3$e$ is configured of the porous silicon, it may be possible that the first conductivity type is the n type and the second conductivity type is the p type; and when the silicon area 3$e$ is configured of the beta iron silicide, it may be possible that the first conductivity type is the p type and the second conductivity type is the n type.

The argon added area 6$e$ is an area to which the argon is added, and is formed in a semiconductor area formed of the silicon substrate 2$e$ and the silicon layer 4$e$. The argon added area 6$e$ is formed from the first surface S1$e$ of the silicon substrate 2$e$ to the inside of the silicon substrate 2$e$. In FIG. 8E, the argon concentration profile in the argon added area 6$e$ is shown. The argon is distributed from a depth position z9 of an interface S1$e$ to a depth position z10 that is deeper than the silicon area 3$e$ within the silicon substrate 2$e$. When the silicon area 3$e$ is configured of the porous silicon, the argon added area 6$e$ includes an area that indicates an argon concentration of $1 \times 10^{18}$ cm$^{-3}$ to $2 \times 10^{20}$ cm$^{-3}$. The argon added area 6$e$ more preferably includes an area indicating an argon concentration of $2 \times 10^{18}$ cm$^{-3}$ to $1 \times 10^{20}$ cm$^{-3}$. When the silicon area 3$e$ is configured of the beta iron silicide, the argon added area 6$e$ includes an area that indicates an argon concentration of $1 \times 10^{18}$ cm$^{-3}$ to $1 \times 10^{20}$ cm$^{-3}$. The argon added area 6$e$ more preferably includes an area indicating an argon concentration of $2 \times 10^{18}$ cm$^{-3}$ to $1 \times 10^{20}$ cm$^{-3}$. As shown in FIG. 8E, the argon concentration has its peak in the vicinity of the first surface S1$e$. In an example shown in FIG. 8E, the argon added area 6$d$ includes, from the first surface S1$e$ of the silicon substrate 2$e$, the silicon area 3$e$ to reach the interior of the silicon substrate 2$e$. The passivation film 8$e$ is a silicon oxide film, for example, and is arranged on the third surface S3$e$ of the silicon layer 4$e$.

The contact hole H1$e$ is arranged in the passivation film 8$e$ to expose the third surface S3$e$ of the silicon layer 4$e$. The second electrode 14$e$ is arranged on the passivation film 8$b$ (on the third surface 3$e$), and is electrically connected via the contact hole H1$e$ to the silicon layer 4$e$. The second electrode 14e is a conductive metal (aluminum or the like, for example). The first electrode 12e is a conductive metal (aluminum or the like, for example), and is arranged on the second surface S2e of the silicon substrate 2e. In the silicon semiconductor device 1e having the above-described configuration, when a bias voltage is applied to the second electrode 14e and the first electrode 12e, light emission is caused in the argon added area 6e.

Light-emission characteristics of the silicon semiconductor device 1e according to the fifth embodiment are similar to that in FIG. 9A and FIG. 9B when the silicon area 3e is configured of the porous silicon, and similar to that shown in FIG. 10A and FIG. 10B when the silicon area 3e is configured of the beta iron silicide. Thus, a description of the light-emission characteristics of the silicon semiconductor device 1e are omitted.

Subsequently, with reference to FIG. 12A to FIG. 12E, a process for producing the silicon semiconductor device 1e according to the fifth embodiment will be described. First, the silicon substrate 2e is prepared (FIG. 12A). By using the HIP device, the argon is then added from the first surface S1e of the silicon substrate 2e. In this case, the silicon substrate 2e is mounted on a substrate-loading base within the HIP device. The second surface S2e of the silicon substrate 2e is in contact with the surface of the base. The first surface S1e is exposed for 30 minutes to 6 hours to an argon-containing atmosphere which is adjusted to temperatures of 400° C. to 900° C. and pressures of 4 MPa to 200 MPa. Thereby, the argon is added from the first surface S1e. The addition of the argon forms the argon added area 6e (FIG. 12B). Argon adding conditions are: pressures of 4 MPa to 200 MPa under the argon atmosphere; temperatures of 400° C. to 900° C.; and a processing time of 30 minutes to 6 hours. As the argon adding method, any method such as an ion implantation method, a sputtering method, or the like, may be used.

The silicon layer 4e is next formed on the first surface S1e of the silicon substrate 2e (FIG. 12C). The thickness of the silicon layer 4e is approximately 50 nm to several μm. Subsequently, a passivation film 84 is formed on the third surface S3e of the silicon layer 4e (FIG. 12D). Next, the contact hole H1e is arranged in the passivation film 84 to form the passivation film 8e, and the second electrode 14e is formed on the passivation film 8e and the first electrode 12e is formed on the second surface S2e of the silicon substrate 2e. Thereafter, through a process such as dicing or the like, the silicon semiconductor device 1e is produced (FIG. 12E).

A correlation between the argon adding conditions (pressure, temperature, and processing time) and the PL intensity according to the fifth embodiment is similar to that between the argon adding conditions (pressure, temperature, and processing time) and the PL intensity according to the first embodiment (that is, the correlations shown in FIG. 5A, FIG. 5B, and FIG. 5C). Thus, a description of the correlation between the argon adding conditions (pressure, temperature, and processing time) and the PL intensity according to the fifth embodiment is omitted.

Sixth Embodiment

Based on FIG. 8C and FIG. 8F, a configuration of a semiconductor device 1f will be described. FIG. 8C is a cross-section showing the configuration of the semiconductor device 1f. FIG. 8F is a graph showing an argon concentration profile in the semiconductor device 1f, in which a horizontal axis indicates an argon concentration and a vertical axis indicates a depth from a surface. As shown in FIG. 8C, the silicon semiconductor device 1f is provided with a silicon substrate 2f and an argon added area 6f.

The silicon substrate 2f includes a silicon area 3f, and the silicon area 3f is arranged so as to have a thickness inwardly from a first surface S1f of the silicon substrate 2f. The silicon area 3f is configured of either one of porous silicon or beta iron silicide. The remaining area, other than the silicon area 3f, of the silicon substrate 2f is formed of single crystal silicon, for example. The argon added area 6f is an area, to which the argon is added, within the silicon substrate 2f. The argon added area 6f is formed from the first surface S1f of the silicon substrate 2f to the inside of the silicon substrate 2f. In FIG. 8F, the argon concentration profile in the argon added area 6f is shown. The argon is distributed from an exposed-surface position z11 of the silicon area 3f to a depth position z12 that is deeper than the silicon area 3f within the silicon substrate 2f. When the silicon area 3f is configured of the porous silicon, the argon added area 6f includes an area that indicates an argon concentration of $1 \times 10^{18}$ $cm^{-3}$ to $2 \times 10^{20}$ $cm^{-3}$. The argon added area 6f more preferably includes an area indicating an argon concentration of $2 \times 10^{18}$ $cm^{-3}$ to $1 \times 10^{20}$ $cm^{-3}$. When the silicon area 3f is configured of the beta iron silicide, the argon added area 6f includes an area that indicates an argon concentration of $1 \times 10^{18}$ $cm^{-3}$ to $1 \times 10^{10}$ $cm^{-3}$. The argon added area 6f more preferably includes an area indicating an argon concentration of $2 \times 10^{18}$ $cm^{-3}$ to $1 \times 10^{20}$ $cm^{-3}$. As shown in FIG. 8F, the argon concentration has its peak in the vicinity of the first surface S1f.

Light-emission characteristics of the silicon semiconductor device 1f according to the sixth embodiment are similar to that in FIG. 9A and FIG. 9B when the silicon area 3f is configured of the porous silicon, and similar to that shown in FIG. 10A and FIG. 10B when the silicon area 3f is configured of the beta iron silicide. Thus, a description of the light-emission characteristics of the silicon semiconductor device 1f is omitted.

Subsequently, with reference to FIG. 13A and FIG. 13B, a process for producing the silicon semiconductor device 1f according to the sixth embodiment will be described. First, the silicon substrate 2f is prepared (FIG. 13A). By using the HIP device, the argon is then added from the first surface S1f of the silicon substrate 2f. In this case, the silicon substrate 2f is mounted on a substrate-loading base within the HIP device. A surface opposite the first surface S1f of the silicon substrate 2f is in contact with the surface of the base. The first surface S1f is exposed for 30 minutes to 6 hours to an argon-containing atmosphere which is adjusted to temperatures of 400° C. to 900° C. and pressures of 4 MPa to 200 MPa. Thereby, the argon is added from the first surface S1f. The addition of the argon forms the argon added area 6f. Argon adding conditions are: pressures of 4 MPa to 200 MPa under the argon atmosphere; temperatures of 400° C. to 900° C.; and a processing time of 30 minutes to 6 hours. As the argon adding method, any method such as an ion implantation method, a sputtering method, or the like, may be used. Thereafter, through a process such as dicing, the silicon semiconductor device 1f is produced (FIG. 13B).

A correlation between the argon adding conditions (pressure, temperature, and processing time) and the PL intensity according to the sixth embodiment is similar to that between the argon adding conditions (pressure, temperature, and processing time) and the PL intensity according to the above-described first embodiment (that is, the correlations shown in FIG. 5A, FIG. 5B, and FIG. 5C). Thus, a description of the correlation between the argon adding conditions (pressure, temperature, and processing time) and the PL intensity according to the sixth embodiment is omitted.

In the above-described descriptions, "approximately" of each parameter means to include an error within ±30%, and preferably means to include an error within ±10%.

What is claimed is:

1. A semiconductor device, comprising:
a silicon substrate of a first conductivity type, including a first surface and a second surface opposite the first surface;
a silicon layer of a second conductivity type, arranged on the first surface of the silicon substrate, including a third surface opposite a junction surface with the silicon substrate;
a first electrode arranged on the second surface;
a second electrode arranged on the third surface; and
an argon added area formed in a semiconductor area formed of the silicon substrate and the silicon layer, wherein
the argon added area includes an area having an argon concentration of a minimum of $1 \times 10^{18}$ cm$^{-3}$ and a maximum of $2 \times 10^{20}$ cm$^{-3}$,
wherein the silicon substrate is comprised of a single-crystal silicon.

2. The semiconductor device according to claim 1, wherein the argon added area is formed from the third surface to the inside of the semiconductor area, or from the first surface to the inside of the silicon substrate.

3. A semiconductor device comprising a silicon substrate, including an argon added area to which argon is added, having a first surface, wherein the argon added area
includes an area having an argon concentration of a minimum of $1 \times 10^{18}$ cm$^{-3}$ and a maximum of $2 \times 10^{20}$ cm$^{-3}$, and
is formed from the first surface to the inside of the silicon substrate,
wherein the silicon substrate is comprised of a single-crystal silicon.

* * * * *